United States Patent [19]

Sargent et al.

[11] 4,040,892

[45] Aug. 9, 1977

[54] METHOD OF ETCHING MATERIALS INCLUDING A MAJOR CONSTITUENT OF TIN OXIDE

[75] Inventors: Paul L. Sargent, Schenectady; Mario Ghezzo, Ballston Lake, both of N.Y.

[73] Assignee: General Electric Company, Schenectady, N.Y.

[21] Appl. No.: 676,370

[22] Filed: Apr. 12, 1976

[51] Int. Cl.$^2$ .............................................. C23F 1/02
[52] U.S. Cl. .................................. 156/659; 96/36.2; 252/79.2
[58] Field of Search ......................... 156/2, 6, 7, 8, 13, 156/17, 18, 659, 667; 252/79.2; 134/3; 96/36.2

[56] References Cited

U.S. PATENT DOCUMENTS

| | | | |
|---|---|---|---|
| 2,608,980 | 9/1952 | Snyder et al. | 134/3 |
| 3,160,539 | 12/1964 | Hall et al. | 156/17 |
| 3,480,491 | 11/1969 | Reisman et al. | 156/17 |
| 3,497,407 | 2/1970 | Esch et al. | 156/17 |
| 3,669,774 | 6/1972 | Dismukes | 156/17 |
| 3,772,102 | 11/1973 | Tiemann et al. | 156/13 |
| 3,837,944 | 9/1974 | Cole, Jr. | 156/8 X |
| 3,979,240 | 9/1976 | Ghezzo | 156/17 X |

OTHER PUBLICATIONS

Caley, The Action of Hydriodic Acid on Stannic Oxide, Journal of American Chemical Society, vol. 54, pp. 3240-3243, 1932.

Dyer, HI-H$_2$ Vapor Etch for Low Temperature Silicon Epitaxial Manufacturing, AICHE. Journal, vol. 18, No. 4, pp. 728-734.

*Primary Examiner*—William A. Powell
*Assistant Examiner*—Thomas Bokan
*Attorney, Agent, or Firm*—Julius J. Zaskalicky; Joseph T. Cohen; Jerome C. Squillaro

[57] ABSTRACT

A method of etching a desired pattern in a layer of material including a major constituent of tin oxide is provided. A film of material which is resistant to the etching action of hot concentrated hydroiodic acid is formed on the layer and patterned. Portions of the layer uncovered by the patterned film are etched with hot concentrated hydroiodic acid.

7 Claims, 3 Drawing Figures

METHOD OF ETCHING MATERIALS INCLUDING A MAJOR CONSTITUENT OF TIN OXIDE

The present invention relates to a method of etching materials which include tin oxide as a major constituent and more particularly relates to a method of selectively etching a layer of a binary compound of tin oxide as a major constituent and antimony oxide as a minor constituent.

Present methods of etching layers of binary compounds of tin oxide and antimony oxide, referred to as antimony tin oxide, are based on a reduction reaction. The reaction takes place in an alkaline or acidic solution at room temperature and is promoted by the presence of elemental zinc or aluminum in intimate contact with the surface of the layer. The reaction products are then washed away in an acidic aqueous solution, preferably hydrochloric acid. The most common method for selectively patterning an antimony tin oxide layer consists of immersing a partially masked layer and its supporting substrate into a freshly prepared slurry of zinc powder and concentrated hydrochloric acid. For improving the adhesion of the zinc particles, the antimony tin oxide layer can be coated with an organic solution containing elemental zinc prior to immersion in the hydrochloric acid solution. Such a method is described and claimed in U.S. Pat. No. 3,837,944 assigned to the assignee of the present invention. As grains of zinc powder are comparable in size to the microelectronic pattern elements, for example, a few microns, the methods just described provide inadequate edge resolution due to enhanced etching action of the layer of antimony tin oxide at places where the zinc grains are located. For overcoming this problem evaporation of a layer of aluminum or zinc over the layer of antimony tin oxide which has been partially covered by a suitable etch mask has been proposed in the literature. This method is suitable only for very thin layers of antimony tin oxide, as only a superficial portion of the layer of antimony tin oxide is in contact with the evaporated layer of aluminum or zinc where the etching takes place.

The present invention is directed to overcoming limitations such as pointed out above in the etching of layers of oxide compounds including tin oxide as a major consituent and in particular to the etching of layers of antimony tin oxide.

It is an object of the present invention to provide a simple, reliable and economical method for etching with high uniformity layers of material which include tin oxide as a major constituent.

In carrying out the invention in one illustrative embodiment thereof there is provided a substrate comprising an insulating material such as silicon dioxide on which a layer of antimony tin oxide has been deposited. A film of a material which is resistant to the etching action of hot concentrated hydroiodic acid is deposited over the surface of the layer. A pattern which it is desired to etch into the layer of antimony tin oxide is formed in the film of material thereby exposing portions of the layer of antimony tin oxide uncovered by the patterned film. The uncovered portions of the layer of antimony tin oxide are etched in a concentrated solution of hot hydroiodic acid.

The novel features which are believed to be characteristic of the present invention are set forth with particularity in the appended claims. The invention itself together with further objects and advantages thereof may best be understood by reference to the following description taken in connection with the accompanying drawings wherein FIG. 1 is a perspective view of a body which includes a suitable substrate on which a layer of antimony tin oxide has been formed.

Figure 1:
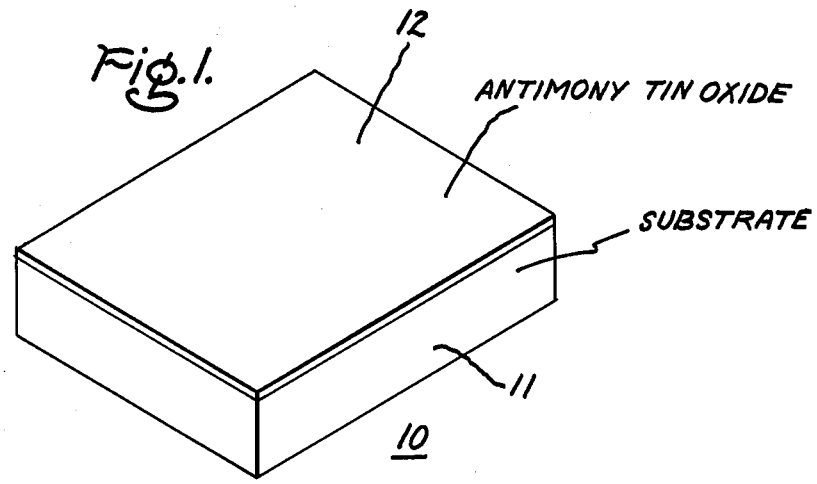

Referring now to FIG. 1, there is shown a composite body 10 including a substrate 11 on which has been deposited a layer 12 of antimony tin oxide. The substrate may constitute an elemental semiconductor material such as silicon or germanium or a compound semiconductor material such as gallium arsenide or gallium phosphide. The substrate may also comprise an insulating material such as silicon dioxide, silicon nitride or aluminum oxide or a suitable ceramic material such as sapphire or spindel. The substrate may also comprise various metallic materials such as molybdenum, tungsten, platinum, gold and tantalum. The substrate may further comprise a plurality of materials for example, an underlying layer of silicon on which is formed a layer of insulating material such as silicon dioxide.

Figure 2:
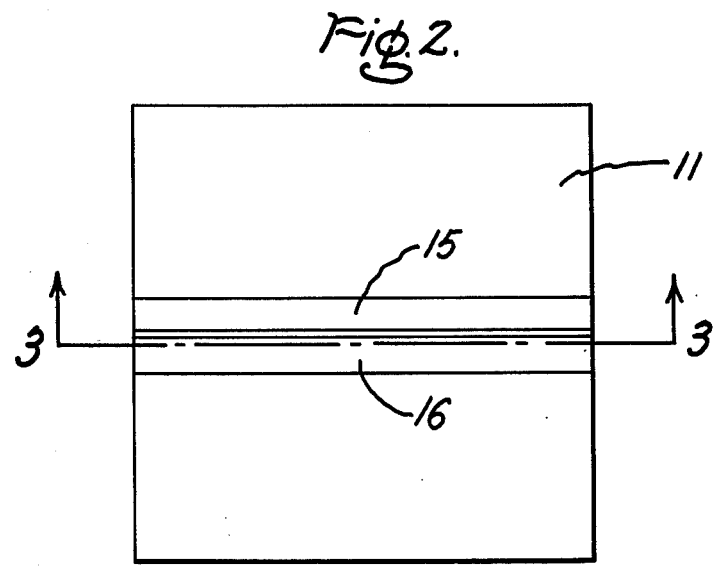
FIG. 2 is a plan view of the body of FIG. 1 after processing in accordance with the present invention to form a pattern in the layer of antimony tin oxide.
Figure 3:
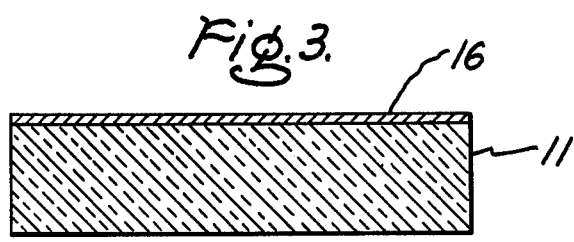
FIG. 3 is a sectional view of FIG. 2 taken along section lines 3—3.

FIG. 2 shows a pair of conductive electrodes 15 and 16 constituting a desired pattern formed in the layer of antimony tin oxide in accordance with the process of the present invention. The electrodes are shown in the form of straight strips with adjacent edges closely spaced. In accordance with the present invention such edges can be formed closer than 2.5 microns in layers of antimony tin oxide with appreciable thickness, that is, of the order of 1.0 microns. FIG. 3 is a sectional view through the electrodes 15 and 16.

This invention will be described in connection with a specific example. A substrate of silicon semiconductor material 2 inches in diameter and about 10 mils thick with a layer of thermally grown silicon dioxide about 1000 Angstroms thick thereon is provided. A layer of antimony tin oxide 1 micron thick is deposited on the exposed surface of the silicon dioxide layer by the chemical vapor deposition process described and claimed in a copending application Ser. No. 674,547, filed Apr. 7, 1976, and assigned to the assignee of the present invention. Deposition is carried out in a reactor in which the substrate is maintained at a temperature of about 500° C by passing over the heated substrate a gaseous mixture including vapors of tetramethyl tin and antimony pentachloride in a carrier gas of argon and including an excess of oxygen. The molar ratio of the vapors of antimony pentachloride to vapors of tetramethyl tin in the gaseous mixture is set to provide the desired proportions of antimony oxide in the antimony tin oxide layer. Conveniently, this molar ratio of the vapors is set to provide about 1 percent of antimony oxide by weight in the binary compound. The deposition is allowed to proceed until a layer about 1 micron in thickness is deposited. A phosphosilicate glass film having a thickness of about 4000 Angstroms is deposited on the layer of antimony tin oxide by chemical vapor deposition at 450° C from a reactive mixture of silane, phosphine, oxygen and nitrogen. The composition of the binary silicate glass is 5 mol percent phosphorous pentoxide with the balance silicon dioxide. The phosphosilicate glass film is covered or capped by a thin layer of silicon dioxide about 500 Angstroms thick deposited in the same reactor but without phophine flow. Purpose of the capping layer of silicon dioxide is to prevent absorption of moisture from air by the phosphorous pentoxide component of the phosphosilicate glass thereby improving photoresist adhesion to the surface of the phosphosilicate glass layer. Next, the film of phosphosilicate glass is patterned using a negative photoresist for example, Waycoat negative resist made by Philip A. Hunt Chemical Corporation, Palisades Park, N.J., by conventional photolithographic techniques to provide the desired pattern in hardened photoresist. A dilute solution of buffered hydrofluoric acid in water (one part concentrated hydrofluoric, 9 parts of ammonium fluoride solution 40 percent by weight, and 90 parts of water by volume) is used to etch away portions of the phosphosilicate glass film exposed by the patterned photoresist. After etching the desired pattern in the film of phosphosilicate glass, the patterned photoresist is removed in a suitable photoresist stripper such as Chem Strip made by Mallinckrodt Chemical Corporation of St. Louis, Mo. Next in the process, the substrate including the layer of antimony tin oxide and the patterned film of phosphosilicate glass is etched by immersing in a boiling concentrated solution of hydroiodic acid. The hydroiodic acid is constituted of approximately 48% by weight of hydrogen iodide and boils at approximately 127° C. After 5 minutes the portions of the layer of antimony tin oxide not masked by the patterned phosphosilicate glass film are completely dissolved. The patterned film of phosphosilicate glass is then removed using the previously used solution of buffered hydrofluoric acid and water without affecting the exposed regions of thermally grown silicon dioxide which dissolves therein at a much lower rate than the phosphosilicate glass. It was found that with a very highly concentrated solution of hydroiodic acid (52% of hydrogen iodide) the etch rate is at least as rapid as with the 48% concentrated solution.

In accordance with the present invention it was found that layers of antimony tin oxide about 1.0 micron thick applied to the substrate of silicon dioxide and processed as described above to produce strips such as electrodes 15 and 16 had straight edges with deviations from a straight line of less than 0.5 micron thereby enabling a close spacing of edges of adjacent electrodes or strips of antimony tin oxide to within less than 2.5 microns.

While a highly concentrated solution of hydroiodic acid was utilized in the process described above, it will be readily apparent that less concentrated solutions work as well, however the rate of etching of the antimony tin oxide would be less than with the more concentrated solution. For example, for a layer of antimony tin oxide including about 1% antimony oxide by weight, it was found that when the concentration of hydroiodic acid was dropped from 48% to 40% of hydrogen iodide the etch rate was decreased by about a factor of four. Also, concentrated solutions of hydroiodic acid of temperature lower than the boiling temperature thereof may be utilized; however, the rate of etching of the antimony tin oxide would be less than with the solution at boiling temperature. For example, for a layer of antimony tin oxide including about 1% antimony oxide, it was found that when the temperature of concentrated solution of 48% hydrogen iodide was dropped by about 15% etching virtually ceased. Thus, to obtain a reasonable rate of etch it is essential to use a temperature close to the boiling temperature of the concentrated solution.

While a thickness of 1 micron of antimony tin oxide was used in describing the method of the invention, it will be appreciated that this is not a limiting thickness. While the composition of the antimony tin oxide in the process described above included about 1% antimony oxide, and 99% tin oxide, it will be understood that the process will work for compositions of antimony tin oxide in which the antimony oxide is included in percentages greater than as well as less than 1%, as long as the major constituent of the binary compound is tin oxide.

While in the example described above chemically vapor deposited layer of antimony tin oxide was used, the layer could have been formed by other means such as sputtering from a solid source of antimony tin oxide.

While in the specific example described above, the particular binary compound of antimony tin oxide was used, it will be understood that the invention is applicable as well to other binary compound materials such as phosphorus tin oxide and arsenic tin oxide and to other materials including tin oxide as a major constituent. By major constituent of tin oxide is meant the inclusion of tin oxide in the material in a percentage greater than 50% of the total weight of material. Preferably, the constituents other than the tin oxide are included in substantially smaller percentage than the tin oxide and are referred to as minor constituents.

While the process has been described in connection with the application of antimony tin oxide to a substrate of silicon dioxide, it will be understood that the process is equally applicable to the direct application of antimony tin oxide to other substrates such as mentioned above in connection with FIG. 1. A particularly useful substrate is silicon nitride as it is also transparent and has susbtantially the same index of refraction as antimony tin oxide. When the layer of antimony tin oxide is applied to such other substrates, such substrates should be constituted of a material which at most is etched only slowly by the hot concentrated hydroiodic acid solution used in etching the layer of antimony tin oxide.

While in describing the invention the transfer mask utilized is a phosphosilicate glass of a particular composition, it will be understood that other binary silicate glasses such as borosilicate glasses may be utilized in the masks for patterning the underlying layer of the compound including the major constituent of tin oxide. The use of binary silicate glasses for patterning such materials as antimony tin oxide is described and claimed in a copending patent application Ser. No. 676,367, filed Apr. 12, 1976, and assigned to the assignee of the present invention. Other mask materials such as silicon dioxide may be utilized for masking the layer of antimony tin oxide, particularly where the substrate on which the layer of antimony tin oxide is situated is a material other than silicon dioxide. Metallic materials may also be utilized as transfer masks for etching the underlying layer of antimony tin oxide. Any such metallic material should fulfill certain requirements. The metallic material should be readily formed into a pattern using etchants which do not attack the underlying layer of antimony tin oxide. The hot hydroiodic acid utilized for etching the layer of antimony tin oxide should not etch or etch only very slowly such metallic material. The metallic material should be readily removed without appreciably affecting the other materials of the composite body.

In this specification the film of material utilized as the transfer mask is constituted of a material which is resistant to the etching action of hot concentrated hydroiodic acid. By such statement is meant that the rate of etching of such material by the hot concentrated hydroiodic acid is substantially less than the rate of etching of the layer of underlying material including the major constituent of tin oxide.

While the invention has been described in a specific embodiment it will be appreciated that modifications may be made by those skilled in the art and it is intended by the appended claims to cover all such modifications and changes as fall within the true spirit and scope of the invention.

What we claim as new and desire to secure by Letters Patent of the United States is:

1. A method of etching a first pattern in a layer of a binary compound material including a major constituent of tin oxide and a minor constituent of antimony oxide on a substrate comprising depositing a film of material which is resistant to the etching action of hot concentrated hydroiodic acid over the exposed surface of said layer, forming in said film a second pattern which is substantially identical to said first pattern to expose portions of said layer of material uncovered thereby, etching said uncovered portions of said layer of material in a concentrated solution of hot hydroiodic acid.

2. The method of claim 1 in which the concentration of said solution of hot hydroiodic acid is at least 40 percent by weight.

3. The method of claim 2 in which the temperature of said hot hydroiodic acid is close to the boiling temperature thereof.

4. The method of claim 1 in which said layer is formed on said substrate by chemical vapor deposition from a gaseous mixture of a compound including tin, a compound including antimony, and oxygen.

5. The method of claim 4 in which chemical vapor deposition of said layer on said substrate is performed while said substrate is maintained at a temperature of about 500° C.

6. The method of claim 5 in which said compound of tin is tetramethyl tin.

7. The method of claim 6 in which said compound of antimony is antimony pentachloride.

* * * * *